US008675709B1

(12) United States Patent
Govorkov et al.

(10) Patent No.: US 8,675,709 B1
(45) Date of Patent: Mar. 18, 2014

(54) EXTERNALLY FREQUENCY-CONVERTED CW HYBRID MOPA

(71) Applicant: Coherent, Inc., Santa Clara, CA (US)

(72) Inventors: Sergei Govorkov, Los Altos, CA (US); Andrei Starodoumov, Campbell, CA (US); Arnaud Lepert, Belmont, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/709,929

(22) Filed: Dec. 10, 2012

(51) Int. Cl.
*H01S 3/082* (2006.01)

(52) U.S. Cl.
USPC .............. 372/97; 372/94; 372/105; 372/22; 372/6

(58) Field of Classification Search
USPC .................... 372/97, 94, 105, 22, 6
See application file for complete search history.

(56) References Cited

U.S. PATENT DOCUMENTS

| | | | |
|---|---|---|---|
| 5,696,780 A | 12/1997 | Pieterse et al. | |
| 6,097,742 A | 8/2000 | Caprara et al. | |
| 6,597,493 B2 * | 7/2003 | Islam | 359/334 |
| 7,322,704 B2 | 1/2008 | Shchegrov | |
| 2010/0260210 A1 * | 10/2010 | Spinelli et al. | 372/6 |
| 2011/0306956 A1 * | 12/2011 | Islam | 606/15 |

OTHER PUBLICATIONS

Cieslak et al., "Internal Resonantly Enhanced Frequency Doubling of Continuous-Wave Fiber Lasers", Optics Letters, vol. 36, No. 10, May 15, 2011, pp. 1896-1898.
Clarkson et al., "Novel Resonantly-Enhanced Nonlinear Frequency Conversion Scheme for Cladding-Pumped Fiber Lasers", International Laser Physics Workshop Sarajevo, Jul. 11-15, 2011, 1 page.
Lecomte et al., "Optical Parametric Oscillator with a Pulse Repetition Rate of 39 GHz and 2.1-W Signal Average Output Power in the Spectral Region Near 1.5 μm", Optics Letters, vol. 30, No. 3, Feb. 1, 2005, pp. 290-292.

* cited by examiner

*Primary Examiner* — Kinam Park
(74) *Attorney, Agent, or Firm* — Morrison & Foerster LLP

(57) ABSTRACT

A hybrid CW MOPA includes an OPS-laser resonator delivering radiation in a plurality of longitudinal lasing-modes or wavelengths. The multiple longitudinal mode output is amplified in a fiber-amplifier. Amplified lasing-modes from the fiber-amplifier are frequency-converted by an optically nonlinear crystal in a ring-resonator having the same length as the laser resonator, such that the ring-resonator is resonant for all of the amplified lasing-modes.

17 Claims, 2 Drawing Sheets

EXTERNALLY FREQUENCY-CONVERTED CW HYBRID MOPA

TECHNICAL FIELD OF THE INVENTION

The present invention relates in general to lasers including a master oscillator the output of which is amplified by a power amplifier (MOPA lasers). The invention relates in particular to MOPA lasers in which the output from the power amplifier is frequency-converted by harmonic-generation or optical parametric generation.

DISCUSSION OF BACKGROUND ART

Sources of high-power CW laser radiation at visible wavelengths, for example, green laser-radiation having a wavelength of 532 nanometers (nm) have become of great interest for industrial applications, for example re-crystallization of amorphous silicon layers in display panels, or welding of highly reflective metals such as copper and gold. In the welding application, the "green" wavelength promotes absorption of the beam in the material and leads to void-free welded seams. A power of several hundreds of Watts (W) of CW radiation is required for these applications.

Several different laser arrangements are presently employed for providing high-power visible wavelength CW radiation. Efficiency, reliability and cost are important factors in selecting which arrangement to use for any particular application.

CW external-cavity surface-emitting optically pumped semiconductor lasers (OPS-lasers) allow for efficient intracavity harmonic-generation, OPS-lasers employ an OPS chip comprising a multilayer (multiple quantum-well) gain-structure backed by a mirror with the mirror being one minor of a laser-resonator. The maximum output power available is primarily based on thermal-management limitations of one OPS chip. Power scaling beyond that limit can be effected by employing multiple OPS-chips in a resonator, or combining the output of a multiple resonators by spectral (wavelength) combination, polarization combination, or some combination thereof.

A similar approach is possible using solid-state thin-disk lasers with intra-cavity frequency conversion. Thermal management is relatively simple in thin-disk lasers, however these lasers typically require (for high power operation) complex resonators configured for multiple incidences of laser radiation or pump radiation in a round trip in the resonator.

Another approach is based on frequency-conversion of an output of a single transverse and axial mode ($TEM_{00}$), polarization-maintaining near infra-red (NIR) fiber-laser (fiber MOPA) coupled to a resonant field-enhancement resonator. This fiber-laser approach has benefits of cost-competitiveness and energy-efficient power scaling of the NIR power. However, for harmonic-generation, spectrally-narrow radiation with a bandwidth between about 0.5 nm and about 1.0 nm is required, assuming a standard critical phase-matching scheme.

Attempts to narrow the spectral line-width of the signal in fiber-amplifiers using single-frequency oscillators face a buildup of stimulated Brillouin scattering (SBS). SBS, in turn can produce pulses which can cause optical damage to fiber components. By way of example, for a ytterbium-doped (Yb-doped) fiber having a core-diameter of 25 micrometers ($\mu m$) and a length of 3 meters (m), the maximum power limited by SBS is between about 150 W and about 250 W. Causing a temperature gradient of temperature along the fiber it is possible to somewhat increase the SBS threshold. Nevertheless, any back reflection of radiation into an amplifier fiber can significantly reduce SBS threshold for the single frequency radiation.

In view of the foregoing it is evident that while the fiber-laser (fiber-MOPA) approach has attractive advantages in cost and energy efficiency, the requirement for single-mode, narrow-band operation imposes an eventual limit in power-scaling. There is a need for a resonantly-enhanced, externally frequency-converted fiber-MOPA architecture that does not require single-mode operation.

SUMMARY OF THE INVENTION

In one aspect of the present invention, laser apparatus comprises an OPS-laser resonator configured to deliver continuous-wave (CW) radiation in a plurality of longitudinal lasing-wavelengths, with all lasing-wavelengths within a predetermined wavelength range. The OPS-laser resonator has an optical length determining a wavelength-spacing of the longitudinal lasing-wavelengths. A fiber-amplifier has a gain-fiber arranged to amplify the lasing-wavelengths of the OPS-laser, the gain-fiber has a gain-bandwidth, and has a power-handling limit determined by stimulated Brillouin scattering (SBS) in the fiber. The SBS has a characteristic bandwidth. The wavelength range of the plurality of lasing modes is within the gain-bandwidth of the gain-fiber and the wavelength-spacing of the lasing-wavelength is greater than the SBS-bandwidth. A frequency-converter is arranged to receive the amplified lasing-wavelengths. The frequency-converter includes an optically nonlinear crystal arranged in an enhancement-resonator for converting the plurality of lasing-wavelengths to a corresponding plurality of frequency-converted wavelengths. The enhancement-resonator has an optical a length equal to an integer one or more times the length of the OPS-laser resonator such that the enhancement-resonator provides a plurality of resonance peak-wavelengths having the same wavelength-spacing as the lasing-wavelengths. The optical length of the resonator is actively adjusted such that the resonance-peak wavelengths thereof are adjusted to be equal to the lasing-wavelengths, whereby the lasing wavelengths are equally enhanced by the enhancement-resonator.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
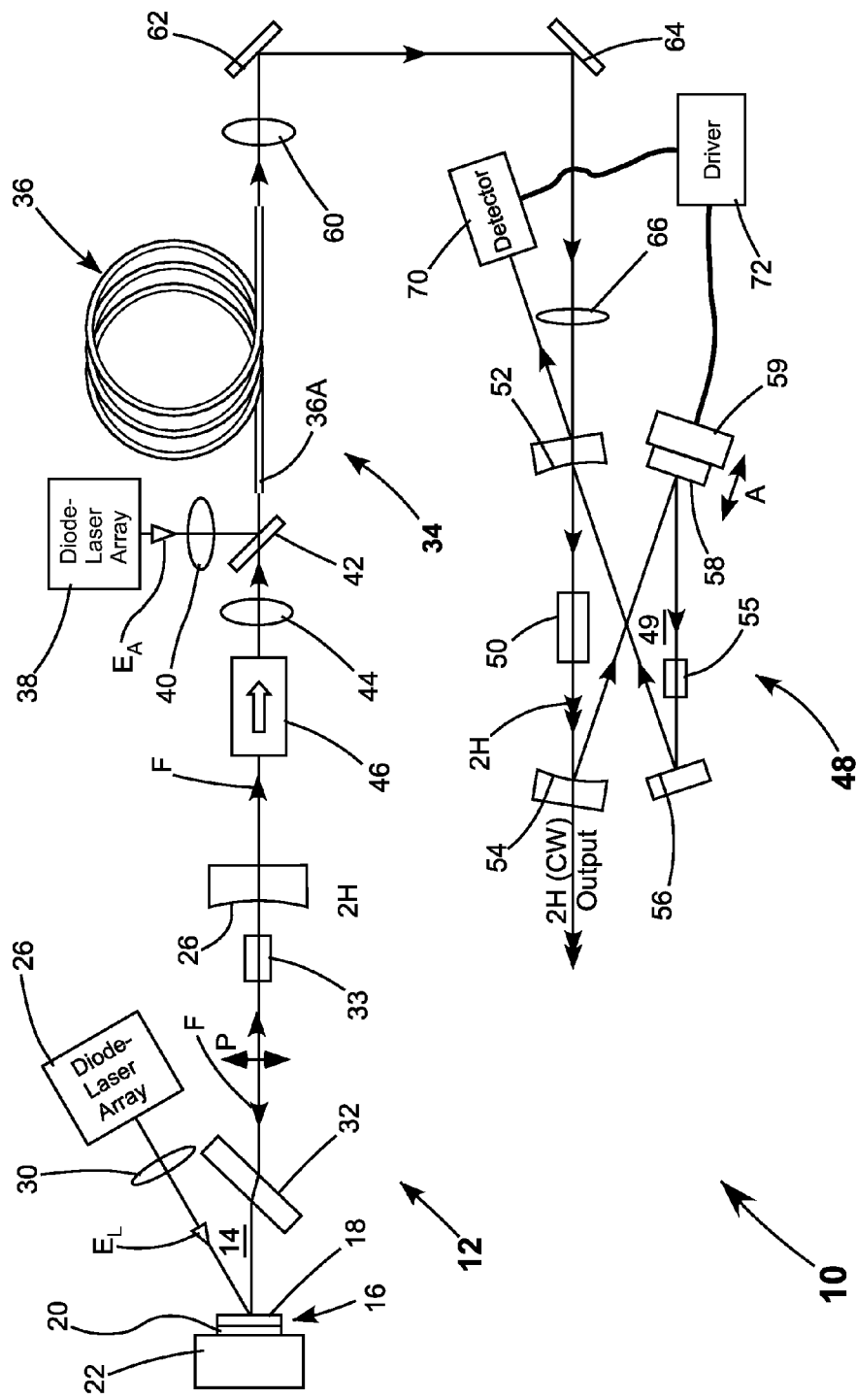
FIG. 1 schematically illustrates one preferred embodiment of an externally frequency-converted hybrid CW MOPA in accordance with the present invention including an OPS-laser resonator arranged to deliver fundamental-wavelength CW radiation in a plurality of longitudinal modes, a large mode-area (LMA) polarization-maintaining fiber-amplifier for amplifying the laser-radiation modes, and an optically nonlinear crystal arranged in a ring-resonator for converting the fundamental-wavelength radiation modes to second-harmonic radiation modes.

Referring now to the drawings, wherein like components are designated by like reference numerals, FIG. 1 schematically illustrates one preferred embodiment 10 of an externally frequency-converted hybrid CW MOPA in accordance with the present invention. MOPA 10 includes an OPS-laser 12, having a laser-resonator 14, and an OPS-chip 16 including a multilayer semiconductor gain-structure 18 surmounting a minor-structure 20. Chip 16 is supported on a heat-sink 22. Laser-resonator 14 is formed between mirror-structure 20 of OPS-chip 16 and a concave mirror 24. Gain-structure 18 is optically pumped by pump-radiation $E_L$ generated by a diode-laser array 26. The radiation is focused by a lens 30 onto the gain-structure.

In response to the optical pumping, radiation having wavelengths characteristic of gain-structure 18 circulates in the laser-resonator as indicated by arrows F. The range of wavelengths is selected from the gain-bandwidth of gain-structure 18 by a birefringent filter 32, which also establishes a plane-polarization orientation of the radiation. As depicted in FIG. 1, birefringent filter 32 sets the polarization-orientation of the fundamental-wavelength radiation in the plane of the drawing as indicated by arrows P. Minor 24 is partially transmissive for the range of wavelengths F such that a portion of the plane-polarized circulating radiation is transmitted from the resonator as fundamental-wavelength, plane-polarized output-radiation.

The output-radiation at the fundamental wavelengths is delivered to a fiber-amplifier 34. Fiber-amplifier 34 includes a gain-fiber 36. This gain-fiber is a large mode area (LMA) polarization-maintaining gain-fiber, having one of two (fast and slow) polarization-axes thereof (not shown) aligned at end 36A thereof with the polarization-plane of the fundamental-wavelength radiation. The LMA fiber could also be so called "photonic-crystal fiber" with cladding having an artificially low index created by sub-wavelength air-spaces formed in the cladding.

Gain-fiber 36 is optically-pumped (energized) by pump radiation $E_A$ delivered by a diode-laser array 38. Radiation EA is directed into gain fiber 36 by a dichroic turning-mirror 42 with a lens 40 provided for focusing radiation $E_A$ into the gain-fiber. A lens 44 focuses the fundamental wavelength-radiation into gain-fiber 36 for amplification. An optical isolator 46 is provided, here, for preventing feedback of amplified stimulated emission from the gain-fiber into OPS-laser 12.

Plane-polarized, amplified, fundamental-wavelength radiation is delivered from fiber-amplifier 34 to a resonant second-harmonic generator 48 for conversion to second-harmonic (2H) radiation. Generator 48 includes an optically nonlinear crystal 50 configured for type-1 second-harmonic generation.

Crystal 50 is included in an enhancement resonator 49, which, in this embodiment of the present invention, is a ring-resonator formed by concave mirrors 52 and 54, a fixed plane-mirror 56, and a plane mirror 58. Fundamental-wavelength radiation from fiber 36 is collimated by a lens 60; directed, here, by turning mirrors 62 and 64; then focused, through mirror 52, into crystal 50 by a lens 66.

Mirror 58 is movable, as indicated by arrow A, by an actuator 59, such as a PZT actuator, for actively adjusting the round-trip-length of the enhancement-resonator such that the fundamental-wavelengths (lasing wavelengths) correspond to resonance-wavelengths of the enhancement-resonator. This provides that all lasing-wavelengths are equally enhanced by the resonator.

Mirrors 54, 56, and 58 are preferably made maximally reflective for fundamental wavelengths of radiation delivered by laser 12. Minor 52 is made highly reflective for these wavelengths but with a small-percentage transmission, for example about one percent, to allow for input to the resonator. This transmission percentage is preferably low enough such that the enhancement-resonator has a Q-factor of 30 or greater. Mirror 54 is made highly transparent for the second-harmonic wavelength to allow 2H-radiation generated by crystal 50 to be delivered from the resonator as CW output.

As noted above, the length adjustment provided by mirror 58 serves to keep the resonator resonant for a fundamental-wavelengths being converted by optically nonlinear crystal 50. The adjustment is preferably made automatically. Methods for such automatic enhancement resonator adjustment are well-known in the art. One simple such method involves monitoring back reflection at an input wavelength from an input minor (here mirror 52) with a detector 70 while making the length adjustment. In a closed-loop arrangement, the monitored back reflection is driven to zero when the resonator length is adjusted by a driver 72 cooperative with actuator 59 to resonance for the input fundamental wavelength.

The present invention is described above in terms of an overall MOPA architecture. There are, however, certain configuration conditions that must be satisfied for proper functioning of the inventive MOPA. A description of these conditions is set forth below with continuing reference to FIG. 1 and with reference in addition to FIG. 2A, FIG. 2B, and FIG. 2C.

Laser-resonator 14 must be configured such that only longitudinal lasing-modes are supported. The laser-resonator is configured to support a minimum of 3 longitudinal modes, corresponding to a minimum resonator length of about 3 mm. More preferably the resonator is configured to support at least 10 longitudinal modes.

The modes, of course will have slightly different wavelengths with the wavelength (frequency spacing) spacing dependent on the optical length of the resonator and the peak gain wavelength of gain structure 18. Some number of these modes and associated wavelengths is selected (for output) from within the gain-bandwidth of gain-structure by birefringent filter 32 in the laser-resonator.

By way of example, in the laser resonator arrangement of FIG. 1, multiple longitudinal mode operation with only the fundamental transverse mode can be supported by a resonator 14 having a length of about 50 mm with concave mirror 24 having a radius of curvature (ROC) of about 1000 mm. For an OPS-laser having a nominal fundamental wavelength of 1060 nm (near infrared), the mode-spacing will be about 0.01 nm, or about 3 gigahertz (GHz). Those skilled in the laser art may design other resonator configurations without departing from the spirit and scope of the present invention using commercial optical engineering software such as Mathematica from Wolfram Research located in Champaign, Ill. A detailed description of high-power lasers having fundamental wavelengths in the near infrared and other wavelength ranges is included in U.S. Pat. No. 6,097,742, the complete discourse of which is hereby incorporated herein by reference.

All of the output wavelengths preferably fit within the gain-bandwidth of gain-fiber 36 of amplifier 34. All of the output wavelengths preferably also fit within the acceptance bandwidth (for second-harmonic conversion) of optically nonlinear crystal 50. By way of example in the arrangement shown, for a crystal of lithium borate (LBO) this bandwidth would be about 0.5 nm. Satisfying these requirements would avoid overall reduction of net output-power of the MOPA by inefficient amplification, or inefficient 2H-conversion of the output of laser 12. A preferred gain-fiber for fiber 36 is ytterbium-doped fiber which can provide suitable optical gain in a wavelength range between about 1020 nm and about 1090 nm.

Particularly important is that the spacing between the fundamental wavelengths must be greater than the bandwidth for SBS. This provides that the power-handling limit for a gain-fiber imposed by SBS is effectively increased by the number of modes amplified. For an ytterbium-doped gain-fiber, the SBS bandwidth is 50 megahertz (MHz), so it is possible to have a plurality of modes (mode-wavelengths) within the acceptance bandwidth of optically nonlinear crystal 50, with the modes being sufficiently separated in wavelength (frequency) to provide adequate mode spacing achieving this desired increase of the SBS-limit.

Particularly important also, is that the optical length of enhancement resonator 49, in which crystal 50 is located, be equal to, or some integer multiple of, the optical length of laser-resonator 14 of OPS-laser 12. The term "optical-length" as used in this description and the appended claims implies that this length is determined by the mechanical spacing between resonator mirrors, and by the thickness and refractive index of any refractive components in the resonators.

Optionally located in laser-resonator 14, or in enhancement-resonator 39, are dispersion adjusting elements 33 and 55 respectively. These provide that the total dispersion in each of the resonators is the same in addition to the optical length being the same. These elements can be elements of any refractive material transparent to the fundamental wavelength. It is also possible to adjust dispersion in the resonators using a suitably designed reflective coating on one or more of the resonator minors, alone or combination with intra-resonator elements. Adjustment of resonator dispersion using refractive elements or reflective coatings has been extensively described in the laser-art relating to pulse-duration control in ultrafast lasers. In this invention, such dispersion-adjustment may be required to ensure that any small alteration of resonator mode-spacing by dispersion in the laser-resonator does not cause the modes to systematically become out of phase with repeated round trips in the enhancement-resonator.

Figure 2A:
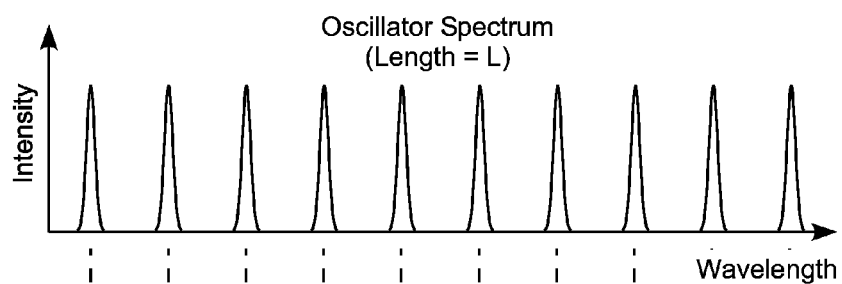
FIG. 2A is a graph schematically illustrating intensity as a function of wavelength for longitudinal lasing modes (an output spectrum) of the OPS-laser resonator of FIG. 1.
Figure 2B:
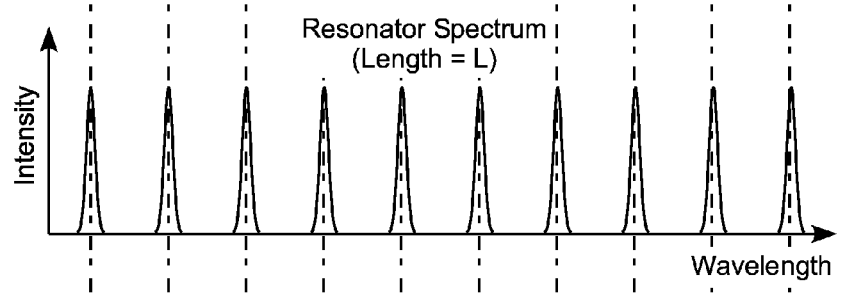
FIG. 2B is a graph schematically illustrating intensity as a function of wavelength for resonant modes of the ring-resonator of FIG. 1, wherein the ring resonator has the same optical length as the OPS-laser resonator and the ring-resonator modes are wavelength-aligned with the lasing modes of FIG. 2A.

FIG. 2A is a graph schematically illustrating intensity as a function of wavelength for a few lasing-modes of laser-resonator 14. FIG. 2B schematically illustrates intensity as a function of wavelength for an enhancement resonator having the same optical length as the resonator of FIG. 2A. This can be considered as the number of wavelengths that can be simultaneously resonant in the resonator, here, with those wavelengths aligned exactly with output wavelengths of the laser resonator.

In practice, the length of enhancement-resonator 49 can first be coarsely adjusted such that the supported mode-spacing (free-spectral-range in resonant cavity terms) is the same as, or some integer submultiple of, the mode-spacing of laser-resonator 14. Whatever method is selected for closed-loop maintenance of the resonance, it will provide for exactly and continuously aligning the possible resonator modes with the input modes from the laser and amplifier as depicted in FIGS. 2A and 2B.

Figure 2C:
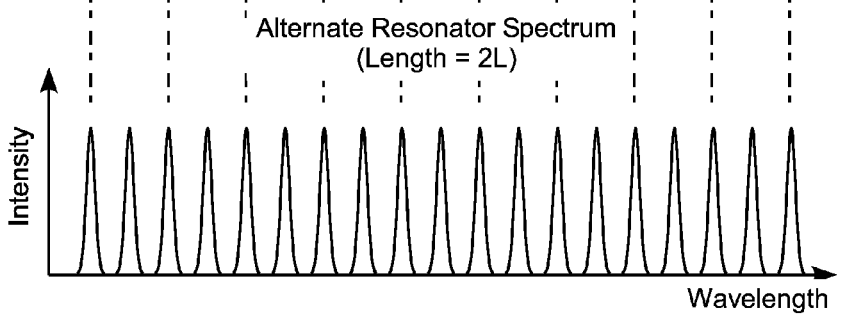
FIG. 2C is a graph schematically illustrating intensity as a function of wavelength for resonant modes of the ring-resonator of FIG. 1, wherein the ring resonator has an optical length twice optical length as the OPS-laser resonator and every other ring-resonator mode is wavelength-aligned with a lasing mode of FIG. 2A.

It should be noted here that the present invention can be effective with a conversion-enhancement resonator having a length which is an integer-multiple of the laser-resonator length. Such a condition is depicted in FIG. 2C, which depicts the resonant-mode spacing of an enhancement-resonator 49 having a length twice that of laser-resonator 14. Here, every other resonant-mode (resonance-wavelength) of resonator 49 is exactly aligned with a lasing-mode of laser-resonator 14.

An OPS-laser is especially suited as the CW fundamental-wavelength radiation source in the above-described inventive MOPA configuration and the above described operating conditions required of the inventive configuration. An OPS-laser has relatively large gain-bandwidth. By way of example for a nominal 1000 nm fundamental wavelength the FWHM gain bandwidth is about 30 nm. This can be restricted by the BRF to reduce variation in mode power while still providing many longitudinal modes of comparable power, and with the mode-spacing required to allow the power limit of the amplifier to be increased by the number of modes.

By employing an OPS-laser resonator including two OPS-chips with nominal fundamental wavelengths (gain-bandwidths) slightly offset, the net gain of a resonator can be made essentially constant over a relatively wide bandwidth to increase the possible number of modes. Further, the OPS-laser is not subject to thermal-lensing problems inherent in solid state gain media. This greatly reduces, if not altogether eliminates, the possibility of differential phase shift between lasing modes with changes in operating power of the laser. Such differential shifts would adversely affect the ability of the conversion-enhancement resonator to actively align mode-for-mode with the lasing-modes, as required in the present invention, and accordingly reduce the conversion efficiency of the enhancement-resonator.

It should also be noted that while the enhancement-resonator is described above as being arranged for second-harmonic generation by frequency multiplication, those skilled in the will recognize without further detailed description or illustration, that crystal 50 could be replaced by a crystal selected and arranged for optical parametric generation. The resonator, while describe above as a ring-resonator could also be a straight resonator, with, of course, the same length limitation. In either case, one or two of the resonator minors would simply need to be configured to deliver from the resonator the signal and idler wavelengths resulting from the parametric generation.

In summary, the present invention is described above in terms of a preferred and other embodiments. The invention, however, is not limited to the embodiments described or depicted. Rather, the invention is limited only by the claims appended hereto.

What is claimed is:

1. Laser apparatus, comprising:
   an OPS-laser resonator configured to deliver continuous-wave (CW) radiation in a plurality of different longitudinal lasing-wavelengths, the OPS-laser resonator having an optical length determining a wavelength-spacing of the longitudinal lasing-wavelengths;
   a fiber-amplifier having a gain-fiber arranged to amplify the lasing-wavelengths of the OPS laser;
   a frequency-converter arranged to receive the amplified lasing-wavelengths, the frequency-converter including an optically nonlinear crystal arranged in an enhancement-resonator for converting the plurality of lasing-wavelengths to a corresponding plurality of frequency-converted wavelengths, the enhancement-resonator having an optical length equal to or an integer multiple of the length of the OPS-laser resonator such that the enhancement-resonator provides a plurality of resonance peak-wavelengths having the same wavelength-spacing as the lasing-wavelengths; and wherein the optical length of the enhancement-resonator is actively adjusted such that the resonance-peak wavelengths thereof having the same wavelength-spacing as the lasing wavelengths are adjusted to be equal to those lasing wavelengths.

2. The apparatus of claim 1, wherein the gain-fiber has a gain-bandwidth and has a power-handling limit for any one lasing wavelength determined by stimulated Brillouin scattering (SBS) in the fiber, the SBS having a characteristic bandwidth, the wavelength-spacing of the lasing-wavelengths being greater than the SBS-bandwidth.

3. The apparatus of claim 2, wherein there is a spectrally selective device within the resonator for limiting the lasing wavelengths to within a predetermined wavelength range less than or equal to about the gain-bandwidth of the gain-fiber.

4. The apparatus of claim 3, wherein the spectrally-selective device is a birefringent filter.

5. The apparatus of claim 3, wherein the optically nonlinear crystal has an acceptance-bandwidth for conversion and the predetermined wavelength range of the lasing wavelengths is within the acceptance bandwidth of the optically nonlinear crystal.

6. The apparatus of claim 1, wherein the optically nonlinear crystal is arranged to frequency-double the lasing-wavelengths to provide frequency-converted wavelengths which are one-half the wavelength of corresponding lasing-wavelengths.

7. The apparatus of claim 1, wherein the optical length of the enhancement-resonator is twice that of the laser resonator and every other resonance-peak wavelength is equal to a corresponding lasing-wavelength.

8. The apparatus of claim 1, wherein the enhancement resonator is a ring-resonator.

9. The apparatus of claim 1 wherein the gain-fiber is an ytterbium-doped gain fiber.

10. Laser apparatus, comprising:
an OPS-laser resonator configured to deliver continuous-wave (CW) radiation in a plurality of longitudinal lasing-wavelengths, with all lasing-wavelengths within a predetermined wavelength range, the OPS-laser resonator having an optical length determining a wavelength-spacing of the longitudinal lasing-wavelengths;

a fiber-amplifier having a gain-fiber arranged to amplify the lasing-wavelengths of the OPS laser, the gain-fiber having a gain-bandwidth and a power-handling limit for any one lasing wavelength determined by stimulated Brillouin scattering (SBS) in the fiber, the SBS having a characteristic bandwidth, the wavelength range of the plurality of lasing-wavelengths being within the gain-bandwidth of the gain-fiber and the wavelength-spacing of the lasing-wavelengths being greater than the SBS-bandwidth;

a frequency-converter arranged to receive the amplified lasing-wavelengths, the frequency-converter including an optically nonlinear crystal arranged in an enhancement-resonator for converting the plurality of lasing-wavelengths to a corresponding plurality of frequency-converted wavelengths, the enhancement-resonator having an optical length equal to or an integer multiple of the length of the OPS-laser resonator such that the enhancement-resonator provides a plurality of resonance peak-wavelengths having the same wavelength-spacing as the lasing-wavelengths; and wherein the optical length of the enhancement-resonator is actively adjusted such that the resonance-peak wavelengths thereof having the same wavelength-spacing as the lasing wavelengths are adjusted to be equal to those lasing wavelengths.

11. The apparatus of claim 10, wherein the optically nonlinear crystal is arranged to frequency-double the lasing-wavelengths to provide frequency-converted wavelengths which are one-half the wavelength of corresponding lasing-wavelengths.

12. The apparatus of claim 10, wherein the optical length of the enhancement-resonator is twice that of the laser resonator and every other resonance-peak wavelength is equal to a corresponding lasing-wavelength.

13. The apparatus of claim 10, wherein the enhancement resonator is a ring-resonator.

14. The apparatus of claim 10 wherein the gain-fiber is an ytterbium-doped gain fiber.

15. The apparatus of claim 10 wherein any one of the laser-resonator and the enhancement-resonator includes a dispersion adjusting element arranged such the laser-resonator and the enhancement resonator have about the same total dispersion.

16. The apparatus of claim 15 wherein the dispersion-adjusting element is a refractive element.

17. The apparatus of claim 15, wherein the dispersion-adjusting element is a reflective element.

* * * * *